United States Patent
Yokajty et al.

(10) Patent No.: US 7,135,352 B2
(45) Date of Patent: Nov. 14, 2006

(54) METHOD OF FABRICATING A COVER PLATE BONDED OVER AN ENCAPSULATED OLEDS

(75) Inventors: Joseph E. Yokajty, Webster, NY (US);
Jeffrey P. Serbicki, Holley, NY (US);
Steven A. Van Slyke, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 236 days.

(21) Appl. No.: 10/787,513

(22) Filed: Feb. 26, 2004

(65) Prior Publication Data

US 2005/0227387 A1    Oct. 13, 2005

(51) Int. Cl.
*H01L 21/00* (2006.01)
*H01L 29/16* (2006.01)

(52) U.S. Cl. ............... 438/68; 438/110; 438/118; 257/82; 257/88; 257/99; 257/432; 257/433

(58) Field of Classification Search ............... None
See application file for complete search history.

(56) References Cited

U.S. PATENT DOCUMENTS

| | | | |
|---|---|---|---|
| 5,920,080 A | * | 7/1999 | Jones ............... 257/40 |
| 6,268,695 B1 | | 7/2001 | Affinito |
| 6,835,950 B1 | * | 12/2004 | Brown et al. ........ 257/40 |
| 6,867,539 B1 | * | 3/2005 | McCormick et al. ... 313/504 |
| 6,897,474 B1 | * | 5/2005 | Brown et al. ........ 257/40 |
| 2003/0143423 A1 | * | 7/2003 | McCormick et al. ... 428/690 |
| 2003/0205317 A1 | | 11/2003 | Ha |
| 2005/0045900 A1 | * | 3/2005 | Silvernail .......... 257/99 |

FOREIGN PATENT DOCUMENTS

| | | | |
|---|---|---|---|
| EP | 1361556 A1 | * | 11/2003 |
| EP | 1 361 556 A1 | | 12/2003 |
| WO | WO0026973 | * | 5/2000 |
| WO | WO0205361 | * | 1/2002 |

OTHER PUBLICATIONS

Craig Adhesives and Coatings Company, UV Pressure Sensitive Adhesives,□□http://www.craigahesives.com/UV/Laminating.htm; and Products,□□http://www/craogadhesives.com/products.htm.*
Silvernail, J. et al., "Packaging OLED Displays Using Dual Stage Pressure Sensitive Adhesives", 15 page Pwer Point Presentation, presented on Oct. 11, 2002.*

* cited by examiner

*Primary Examiner*—Alonzo Chambliss
(74) *Attorney, Agent, or Firm*—Raymond L. Owens

(57) ABSTRACT

A method of bonding a common cover plate over a plurality of OLED devices formed on a device substrate includes providing an unpatterned or a patterned layer of a pressure-sensitive adhesive (PSA) material over a surface of the cover plate; bonding the cover plate over the OLED devices; and singulating individual OLED devices having a bonded cover plate and permitting electrical access to electrical interconnects associated with each OLED device for attaching electrical leads thereto.

14 Claims, 14 Drawing Sheets

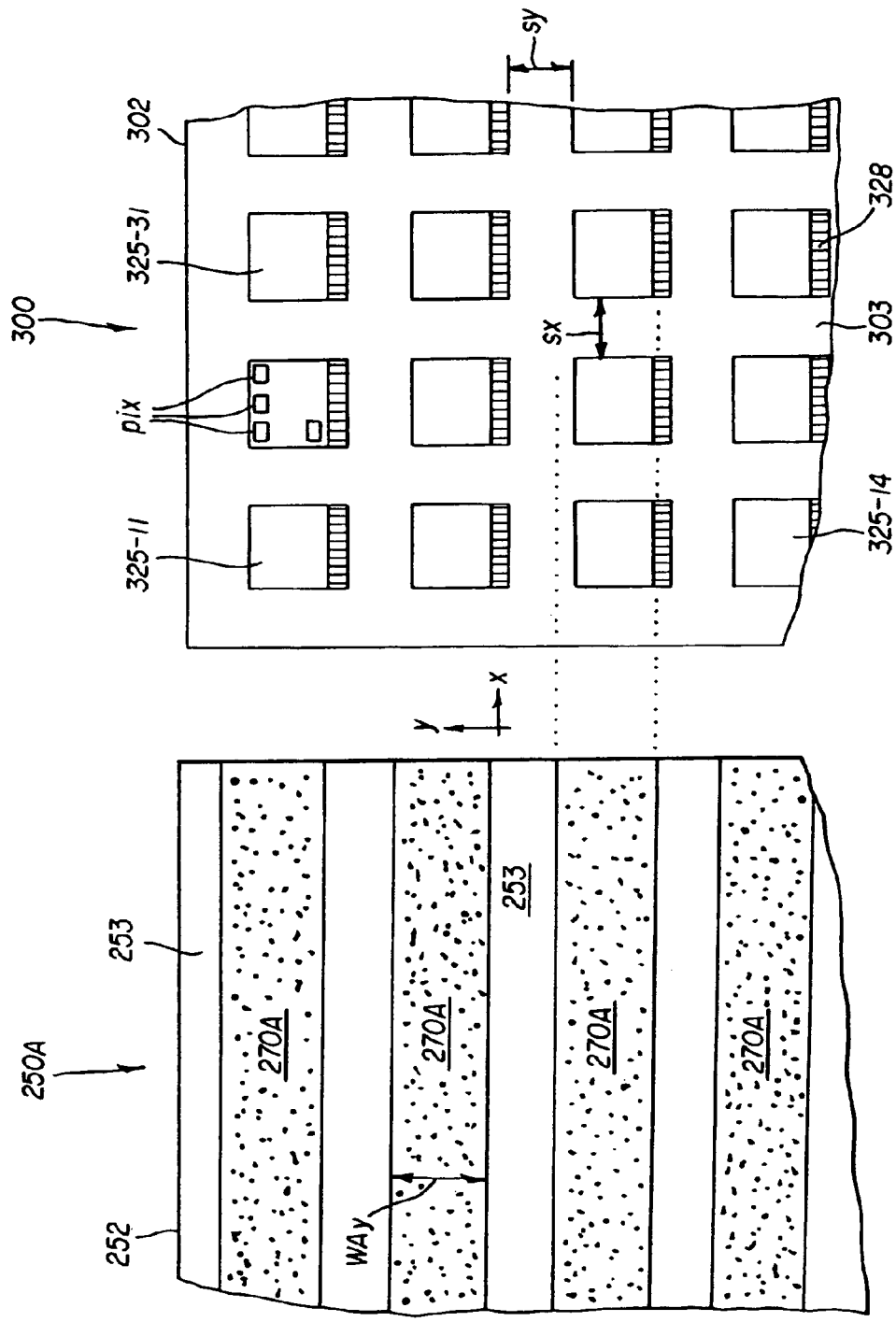

METHOD OF FABRICATING A COVER PLATE BONDED OVER AN ENCAPSULATED OLEDS

FIELD OF THE INVENTION

The present invention relates to environmental protection of top-emitting or bottom-emitting OLED devices.

BACKGROUND OF THE INVENTION

Organic light-emitting diode (OLED) devices, also referred to as organic electroluminescent (EL) devices, have numerous well known advantages over other flat-panel display devices currently in the market place. Among these advantages are brightness of light emission, relatively wide viewing angle, reduced electrical power consumption compared to, for example, liquid crystal displays (LCDs) using backlighting, and a wider spectrum of colors of emitted light in full-color OLED displays.

Applications of OLED devices include active matrix image displays, passive matrix image displays, and area lighting devices such as, for example, selective desktop lighting devices. Irrespective of the particular OLED device configuration tailored to these broad fields of applications, all OLEDs function on the same general principles. An organic electroluminescent (EL) medium structure is sandwiched between two electrodes. At least one of the electrodes is light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the OLED is said to be forward biased. Positive charge carriers (holes) are injected from the anode into the EL medium structure, and negative charge carriers (electrons) are injected from the cathode. Such charge carrier injection causes current flow from the electrodes through the EL medium structure. Recombination of holes and electrons within a zone of the EL medium structure results in emission of light from this zone that is, appropriately, called the light-emitting zone or interface. The emitted light is directed towards an observer, or towards an object to be illuminated, through the light transmissive electrode. If the light transmissive electrode is between the substrate and the light emissive elements of the OLED device, the device is called a bottom-emitting OLED device. Conversely, if the light transmissive electrode is not between the substrate and the light emissive elements, the device is referred to as a top-emitting OLED device.

The organic EL medium structure can be formed of a stack of sublayers that can include small molecule layers and polymer layers. Such organic layers and sublayers are well known and understood by those skilled in the OLED art.

In top-emitting OLED devices, light is emitted through an upper electrode or top electrode which has to be sufficiently light transmissive, while the lower electrode(s) or bottom electrode(s) can be made of relatively thick and electrically conductive metal compositions which can be optically opaque. Consequently, the lower electrodes (anodes) can be formed over relatively complex drive circuitry in an active matrix OLED image display. Top-emitting OLED displays offer the potential to improve display performance compared with bottom-emitting OLED displays by:

1) increasing the aperture ratio, therefore permitting pixels of the display to operate at a lower current density which results in improved operational stability;

2) permitting more complex drive circuitry to enable improved control of pixel current, leading to enhanced display uniformity and to improved display stability;

3) enabling the use of lower mobility materials, e.g. amorphous silicon, to be considered in forming the thin-film transistor (TFT) drive circuitry; and 4) permitting incorporation of elements which can increase the out-coupling of light generated within the organic EL medium structure to provide increased efficiency of emitted light.

However, bottom-emitting OLED devices continue to find widespread use in displays of data or in the field of advertising.

Unprotected OLED display devices, irrespective of device configuration, are prone to relatively rapid degradation of performance due to adverse effects of moisture and/or oxygen present in the ambient environment. Additionally, unprotected devices can be subject to mechanical damage caused by abrasion. Various efforts have been directed at providing packaged OLED displays in which the packaging approaches offer improved operational lifetime of displays which is, however, still limited so that widespread adoption of OLED display devices is currently restricted.

Included in these efforts at providing packaged OLED devices or displays are cover plates which are adhesively bonded over an upper surface of an OLED device. Adhesive bonding of a cover plate has been provided in prior art packaging approaches by either forming a perimeter seal for bonding a cover plate along a device perimeter, or by uniformly bonding a cover plate over an entire device area. Typically, such cover plate bonding has been achieved by dispensing a flowable adhesive material on the cover plate or on the upper surface of the OLED device, bringing the cover plate and the device surface in contact, followed by curing the adhesive material by a thermal curing process or by a radiation curing process.

Representative descriptions of such prior art cover plate bonding approaches are provided in U.S. Patent Application Publications 2002/0187775 A1 by Maruyama et al.; 2002/0193035 A1 by Wei et al.; 2002/0155320 A1 by Park et al.; and commonly assigned commonly assigned U.S. patent application Ser. No. 10/759,914 filed Jan. 16, 2004 by Yokajty et al., entitled "Method of Making an OLED Display Device With Enhanced Optical and Mechanical Properties", the disclosure of which is herein incorporated by reference.

Maruyama et al. propose a perimeter seal which is formed between two concave grooves disposed near perimeter areas of an OLED device. The perimeter seal provides a spacing between a device surface and a surface of a second substrate which functions as a cover plate. This spacing can be filled with an inert gas. Maruyama et al. do not suggest or disclose electrical interconnect areas, nor approaches to keep such interconnects free from perimeter seal material.

Wei et al. disclose a package method and apparatus for organic electroluminescent display. A certain amount of an ultraviolet curing resin or thermal curing resin is spread on a lamination plate or a substrate. A trench is formed at an edge of the lamination plate. Upon aligning the lamination plate with the substrate, the space between the lamination plate and the substrate is controlled by adjusting lamination pressure so that excess resin flows into the trench at the edge of the lamination plate, and the dimensions of the package can be controlled. The resin is cured by ultraviolet radiation or by a thermal process. Thus, Wei et al. provide uniform bonding between the substrate and the lamination plate which functions as a cover plate. Wei et al. do not suggest or disclose electrical interconnect areas nor approaches to keep such interconnects free from resins.

Park et al. disclose a package method and apparatus for organic electroluminescent display. A trench is disposed on at least one of the cover plate or device substrate to prevent perimeter sealing material from contacting the display area of the OLED device. During pressing of the cover plate to the substrate, excess perimeter sealing material resin flows into the trench, and the sealing material is prevented from contacting the display area. Park et al. do not suggest or disclose electrical interconnect areas nor approaches to keep such interconnects free from perimeter sealing material.

While the perimeter seals of Maruyama et al. and of Park et al. can provide improved moisture protection, the lack of a structural buffer layer between the OLED device surface and a lower surface of the cover plate can cause mechanical and optical problems. Mechanical problems include excessive stress to the perimeter seal caused by thermal expansion and contraction under normal device operating conditions leading to leakage of the perimeter seal. Expansion of the gas in the space between the OLED device surface and the lower surface of the cover plate can lead to breakage of the device substrate or cover plate when subjected to lowered environmental pressure, especially for larger-sized displays. Optical problems include undesirable reflective or refractive optical effects at both surfaces of a transparent cover plate which is used in a top-emitting OLED display device.

Serbicki et al. recognized the importance of keeping at least outermost portions of electrical interconnect areas of OLED devices free from a flowable adhesive material. Various configurations of flow-preventing patterns are disclosed which are oriented with respect to a plurality of OLED devices on a device substrate so that flowable adhesive material is prevented from spreading into and beyond these patterns while permitted to spread uniformly over at least the display areas of the OLED devices. Upon curing of the adhesive material, a uniform structural buffer layer serves to uniformly bond a cover plate over an encapsulated surface of a pixelated OLED device while keeping the electrical interconnect areas free from adhesive material.

U.S. Pat. No. 6,268,695, assigned to Battelle Memorial Institute, describes an environmental barrier for an OLED in which a glass cover plate is not used. In this invention, the foundation is coated with three layers: a first polymer layer; a ceramic layer; and a second polymer layer. These layers are substantially transparent to the light emitted by the OLED. This invention creates an environmental barrier for an OLED display, but does not provide mechanical protection for the OLED display, especially from pressure points such as those created when a user touches the surface of the display with his or her finger.

Other effective barrier layers against moisture penetration and/or oxygen penetration into a top-emitting OLED device include a transparent encapsulation layer which can be formed by know thin-film deposition methods such as, for example, thermal vapor deposition, sputter deposition, or atomic layer deposition. Materials particularly suitable as encapsulation layer material include aluminum oxide ($Al_2O_x$), silicon nitride (SiN), silicon-oxinitride ($SiO_xN_{1-x}$), and tantalum oxide ($TaO_x$).

Due to the structure of the thin-film encapsulation layer, they do not provide adequate mechanical protection. For a top-emitting OLED device, a transparent cover plate is required to ensure mechanical protection. However, conventional perimeter sealing of the cover plate to the OLED display substrate results in the aforementioned mechanical and optical problems.

In manufacturing OLED display devices, a plurality of devices are typically manufactured on a device substrate, and are subsequently singulated or cut and separated from the device substrate. Each OLED display device includes a pixelated display area and an electrical interconnect area which is used to connect the singulated OLED display device to external electrical power and control electronics.

Irrespective of the configuration of environmental protection elements, such as an encapsulation layer and a perimeter-sealed cover plate, an encapsulation layer and a uniformly bonded cover plate, or just a perimeter-sealed cover plate, it is important to keep at least the outermost portions of the electrical interconnect area(s) free of encapsulation layer material and of sealing material or adhesive material to ensure reliable electrical connections to the interconnect area or areas.

Flowable adhesive materials are used in the above referenced U.S. Patent Applications to provide bonding between an OLED device and a cover plate either in the form of a perimeter seal or in the form of a uniform bond. The flowable adhesive material has to be dispensed in a measured amount, and curing of the spread adhesive material is required to provide effective bonding.

Dispensing of a flowable adhesive material, or of substantially viscous adhesive materials, requires a dispensing apparatus and may require a precision platform which can be translated along an x-direction and a y-direction if the adhesive is to be dispensed in a pattern. Since the organic EL medium structure of OLED devices is subject to degradation upon exposure to ultraviolet curing radiation or upon exposure to curing temperatures called for in thermally cured adhesives, attention has to be paid to curing conditions so as to avoid degrading the EL medium structure.

Therefore, it would be an advantage to provide a "dry" process of uniformly bonding a commonly shared cover plate over a plurality of encapsulated OLED devices formed on a device substrate. Preferably, curing of a bonding adhesive layer should not be required.

McCormick et al. in U.S. Patent Application Publication 2003/0143423 A1 disclose an organic electronic device which is encapsulated at least in part by an adsorbent-loaded transfer adhesive. The adsorbent may be a desiccant and/or a getterer. The adsorbent-loaded transfer adhesive may form a gasket around the device periphery, or may cover the entire device and its periphery. An encapsulation lid covers the device and the lid is adhered to a device substrate by the adhesive. The transfer adhesive is selected to be permeable to one or both of air and water vapor so that the adsorbent material loaded into the adhesive can getter oxygen and/or adsorb water vapor. All but one of the transfer adhesive materials described by McCormick et al. require either UV-curing, thermal curing, or heating the device during application of a hot-melt adhesive material. A conventional pressure-sensitive adhesive material obviates the need for UV-curing, or for subjecting an OLED device to a thermal process at a temperature and for a duration which can result in degrading one or all of the thin layers comprising the organic EL medium structure.

SUMMARY OF THE INVENTION

It is therefore an object of the present invention to provide a method of packaging a plurality of OLED devices formed on a device substrate, such method overcoming problems of packaging associated with adhesive materials which require curing.

It is another object of the present invention to provide a method of bonding a common cover plate over a plurality of OLED devices formed on a device substrate in which a pressure-sensitive adhesive material is used to achieve uniform bonding over all topological features of the OLED devices.

It is a further object of the present invention to provide a method of bonding a common cover plate over a plurality of OLED devices formed on a device substrate in which a patterned pressure-sensitive adhesive material is applied to the cover plate so that bonding to the device substrate is achieved at least over a display area of each OLED device while keeping electrical interconnect areas of each OLED device free from adhesive material.

In one aspect, these objects are achieved by a method of bonding a cover plate over a plurality of packaged OLED devices formed on a surface of a device substrate wherein each one of the plurality of OLED devices includes a pixelated display area and at least one electrical interconnect area, comprising:

a) providing the device substrate having the plurality of OLED devices formed on a surface thereof;

b) providing the cover plate having disposed on one surface thereof a layer of a pressure-sensitive adhesive material;

c) transporting the cover plate in alignment with the device substrate through a pressure roller apparatus so that the layer of the pressure-sensitive material provides uniform bonding between the cover plate and each OLED device on the device substrate, thereby achieving a plurality of packaged OLED devices; and d) singulating the device substrate and the bonded cover plate to provide a plurality of individual and packaged OLED devices having a bonded cover plate and permitting access to at least outermost portions of the at least one electrical interconnect area for attaching electrical leads thereto.

In another aspect, these objects are achieved by a method of bonding a cover plate over a plurality of OLED devices formed on a surface of a device substrate wherein each one of the plurality of OLED devices includes a pixelated display area and at least one electrical interconnect area, comprising:

a) providing the device substrate having the plurality of OLED devices formed on a surface thereof;

b) providing the cover plate having disposed on one surface thereof a patterned layer of a pressure-sensitive adhesive material and at least at positions corresponding to positions of the pixelated display areas of the OLED devices;

c) transporting the cover plate in alignment with the device substrate through a pressure roller apparatus so that the layer of the pressure-sensitive material provides uniform bonding between the cover plate and at least the pixelated display area of each OLED device on the device substrate, thereby achieving a plurality of packaged OLED devices; and d) singulating the device substrate and the bonded cover plate to provide a plurality of individual and packaged OLED devices having a bonded cover plate and permitting access to at least outermost portions of the at least one electrical interconnect area for attaching electrical leads thereto.

BRIEF DESCRIPTION OF THE DRAWINGS

FIG. 6A depicts schematically a plan view of a cover plate having provided thereon a plurality of unidirectional patterns of a pressure-sensitive adhesive material in accordance with an aspect of the present invention;

FIG. 6B is the same plan view of the device substrate as shown in FIG. 3B;

The drawings are necessarily of a schematic nature since layer thicknesses are frequently in the sub-micrometer range and pixel dimensions can be in a range of 5–250 micrometer, while lateral dimensions of device substrates and of cover plates can be in a range of 10–50 centimeter. Accordingly, the drawings are scaled for ease of visualization rather than for dimensional accuracy.

DETAILED DESCRIPTION OF THE INVENTION

As used herein, the term "transparent" refers to an encapsulation layer, a layer of a pressure-sensitive adhesive material, a cover plate in a top-emitting OLED device configuration, as well as anode electrode layer(s), and a device substrate in a bottom-emitting OLED device configuration, and denotes an optical transmission of at least 80% of a light directed perpendicularly at a surface of such members. The term "optically reflective" refers to a cover plate surface in a bottom-emitting OLED device configuration, and denotes a reflectance greater than 60% of light directed perpendicularly at such surface. The term "optically absorptive" refers to a cover plate surface in a bottom-emitting OLED device configuration, and denotes an absorption of at least 90% of light directed perpendicularly at such surface. The term "pixel" is generally used to designate the smallest addressable element of a pixelated OLED display, and denotes herein the light-emitting portion of a pixel.

FIGS. 1A–1D indicate schematically a process which results in bonding with a layer of a pressure-sensitive adhesive (PSA) material a common cover plate over and between a plurality of OLED devices, which can be encapsulated, formed on a device substrate.

Figure 1A:
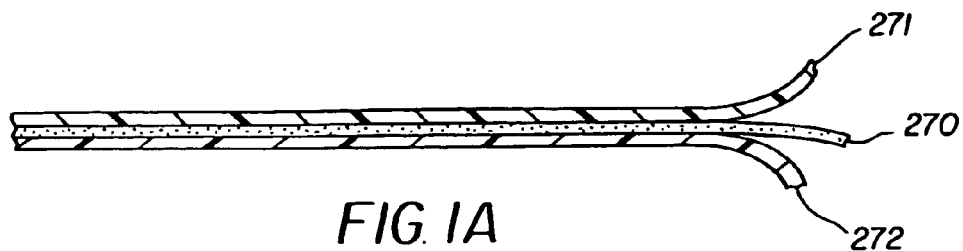
FIG. 1A is a schematic sectional view of a layer of pressure-sensitive adhesive material disposed between first and second release liners.

FIG. 1A is a schematic sectional view of a layer 270 of a PSA material disposed between a first release liner 271 and a second release liner 272. Pressure-sensitive adhesive materials disposed between two release liners are commercially available, for example, from 3M Company of (St. Paul, Minn., USA) in the form of a roll which can be cut into sheets of a desired size or area. The release liners can be made of a polyester material or of other materials which can be readily peeled off, or released from the adhesive layer 270. The adhesive layer 270 can be formed of an acrylic adhesive material or of other adhesive materials which permit "dry" bonding to a surface or "dry" bonding between two surfaces without a requirement of curing such adhesive bonds.

Figure 1B:
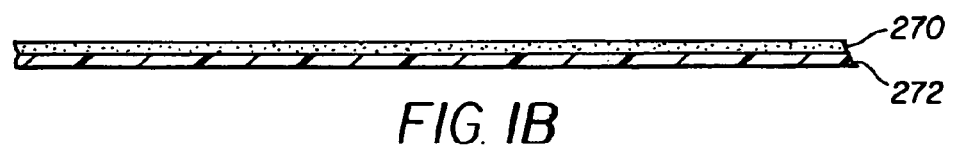
FIG. 1B is a schematic sectional view of the layer of pressure-sensitive adhesive material after peeling the first release liner.

FIG. 1B depicts the PSA-layer disposed on the second release liner 272 after peeling or releasing the first release liner 271.

Figure 1C:
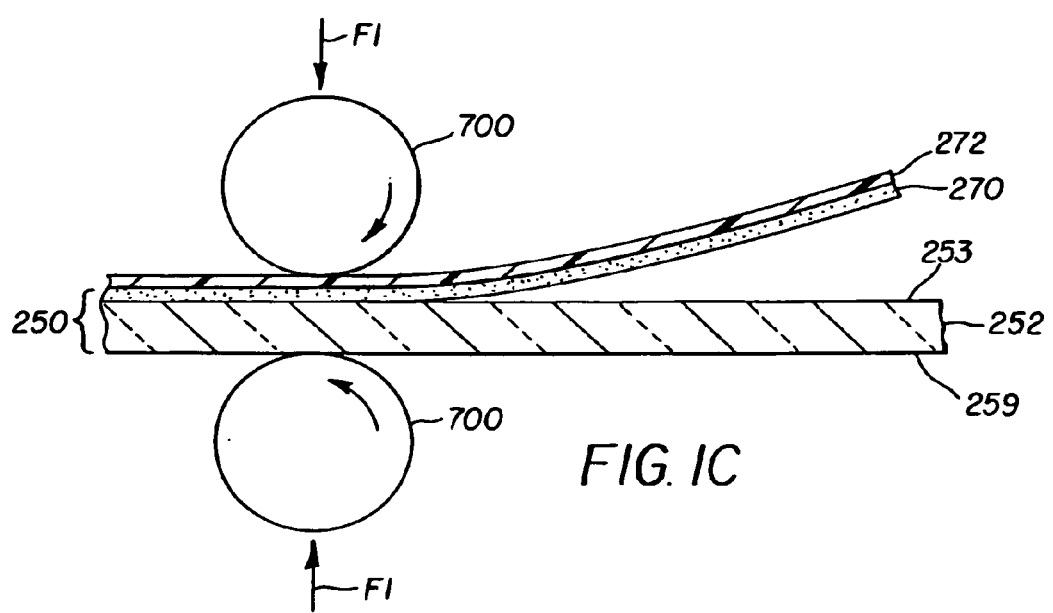
FIG. 1C indicates schematically a pressure roller apparatus for laminating the adhesive layer of FIG. 1B onto a surface of a cover plate.

FIG. 1C indicates schematically the bonding or transferring of the PSA-layer 270 to a first surface 253 of a cover plate 252 which has an opposing second surface 259. The bonding or transferring is achieved by transporting the cover plate 252 and the PSA-layer 270 (disposed on the second release liner 272) through a pressure roller apparatus 700 which is also referred to as a roller laminator. Typically, both rollers of the laminator are driven synchronously by a common drive mechanism and the rotational speed of the rollers can be adjusted to provide a selected speed of transporting the cover plate and the PSA-layer. A force F1 is indicated in FIG. 1C as being directed to each of the rollers of the apparatus 700. In actual construction of the roller laminator, one of the rollers (not identified in the drawing) can be translated in a vertical direction to provide a selected force or a selected pressure with respect to an opposing second roller which is mounted rigidly in such vertical direction. Both pressure rollers of the apparatus 700 can be heated to a temperature in a range of from 40 to 75° C.

A cover plate configuration 250 is obtained which has an unpatterned layer of a PSA material uniformly bonded over at least a portion of the first cover plate surface 253. The second release liner 272 is now peeled off, or released from, the unpatterned layer of the PSA material 270.

Figure 1D:
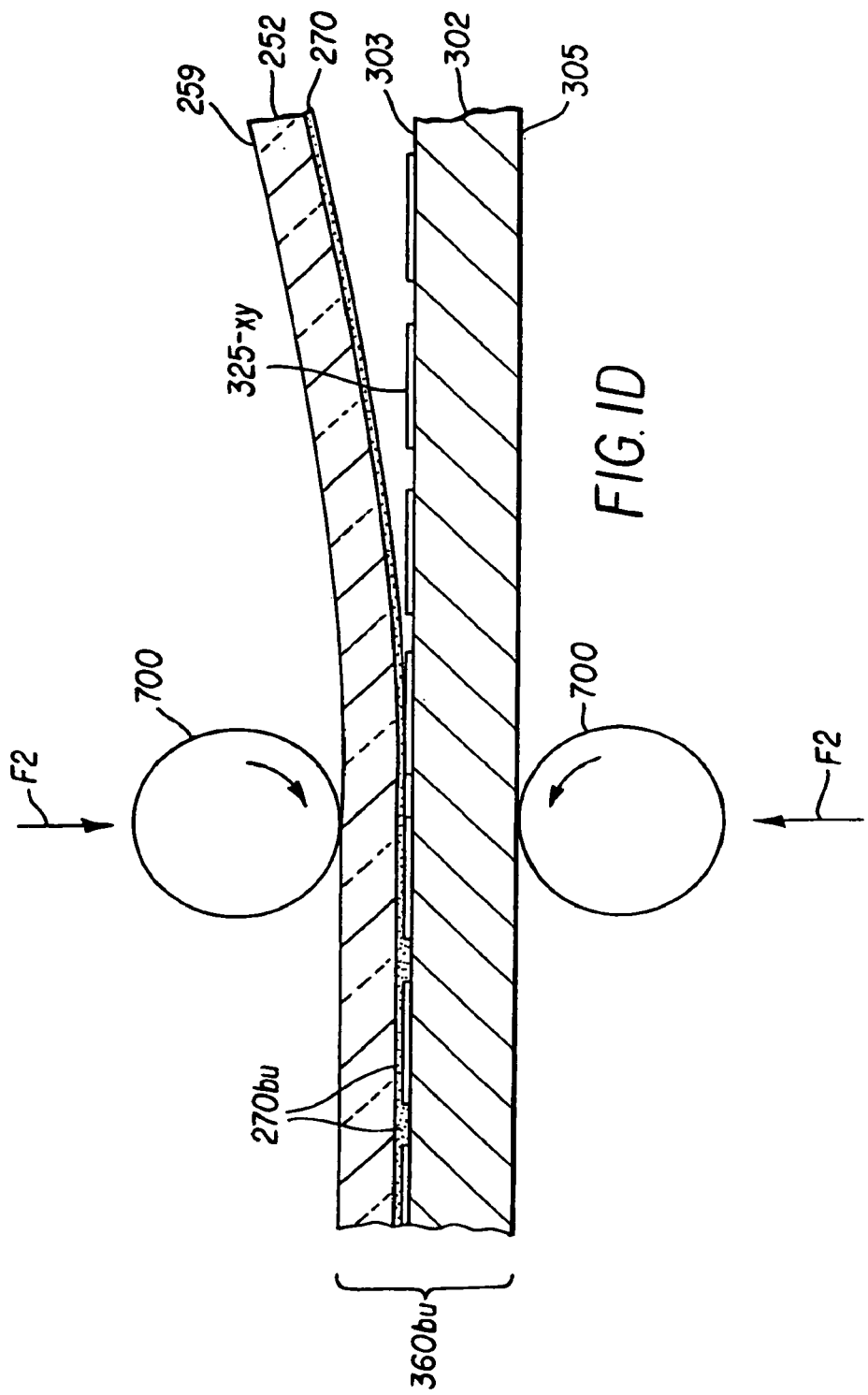
FIG. 1D shows schematically the pressure roller apparatus for bonding the layer of the pressure-sensitive adhesive material formed on the cover plate over and between OLED devices provided on a device substrate.

FIG. 1D shows schematically the process of uniformly bonding the cover plate 252 via the PSA-layer 270 over and between a plurality of OLED devices provided on a first surface 303 of a device substrate 302 having an opposing second surface 305. The position of a pixelated display area of one of the OLED devices is indicated at 325-xy. A force F2, or forces F2, directed in a vertical direction between the pressure rollers of the pressure roller apparatus 700, is selected to result in a bonding layer 270bu of unpatterned PSA material which extends over and between the OLED devices and to provide a bonded assembly configuration 360bu having an unpatterned layer of a PSA material.

In order to achieve uniform bonding of the cover plate over and between OLED devices via the unpatterned layer 270 of the PSA material, the pressure rollers of the apparatus are heated to a temperature in a range of from 40 to 75° C. so that uniform bonding can be provided over all topological features of the OLED devices.

Figure 2:
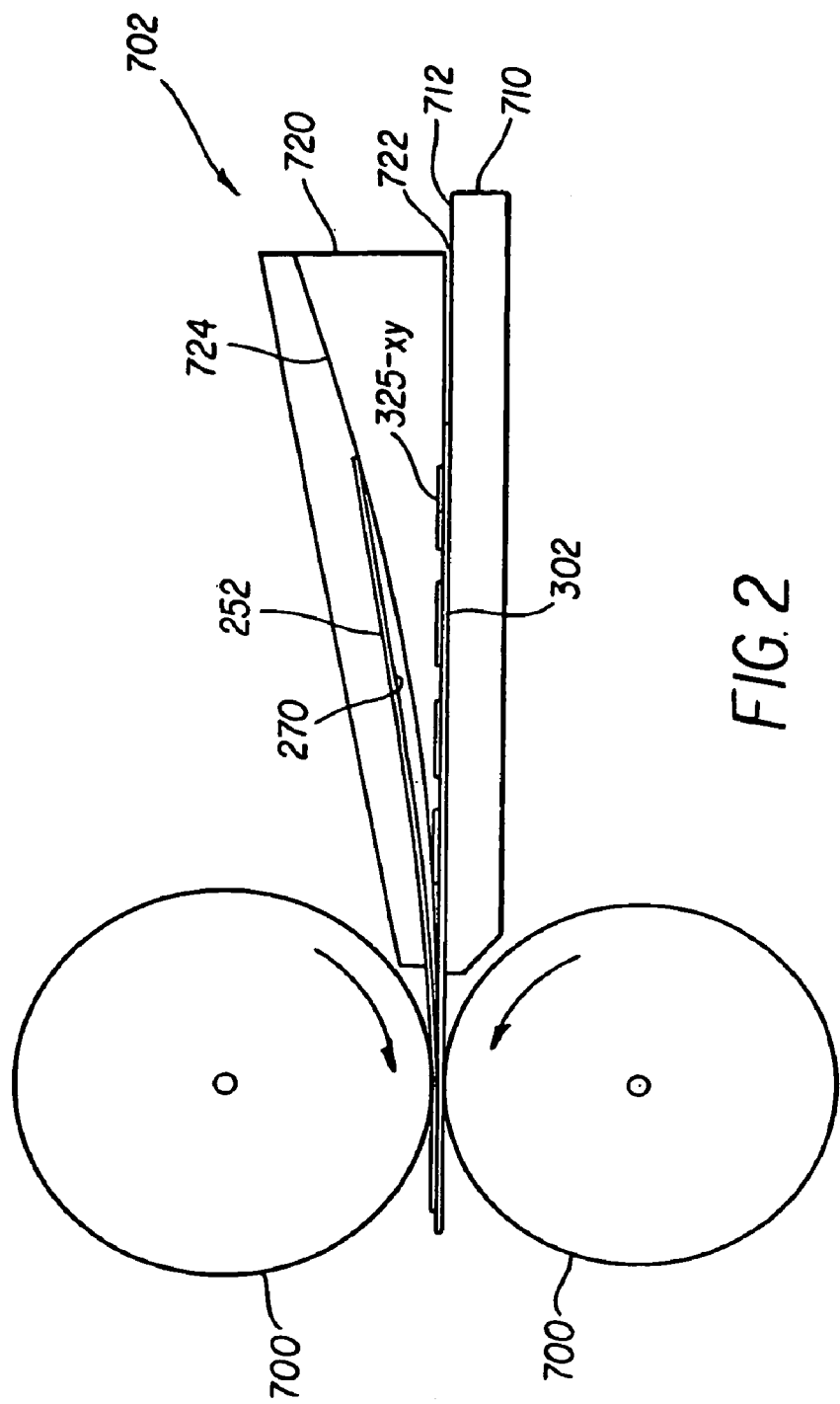
FIG. 2 is a schematic side view of a guiding assembly for guiding the device substrate and the cover plate in lateral registration into a nip of the pressure roller apparatus.

FIG. 2 is a schematic side view of a guiding assembly 702 for guiding the device substrate 302 and the cover plate 252 in lateral registration into a nip region of the roller laminator 700. A device substrate feed table 710 has a feed table surface 712. Fixedly mounted over the surface 712 is a feed guide 720 which includes a feed guide recess 722 for slideably accepting an edge of the device substrate 302. The cover plate 252 bearing the unpatterned layer 270 of the PSA material is guided along a feed guide surface 724 towards the nip region between rollers of the pressure roller apparatus 700. At least one lateral edge of the device substrate 302 and the cover plate 252, respectively, are guided by the guiding assembly 702.

Figures 3A, 3B:
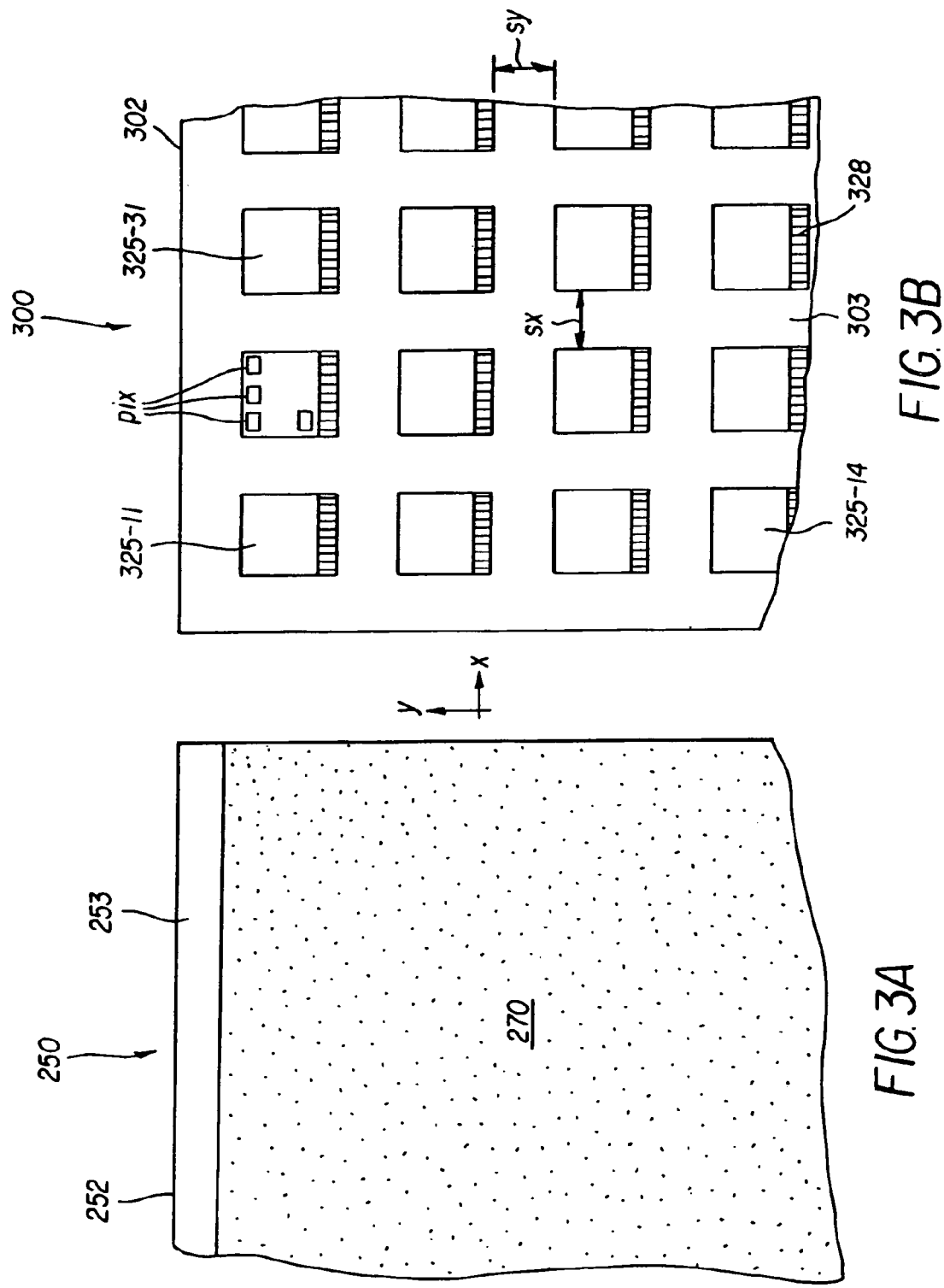
FIG. 3A is a schematic plan view of a cover plate having provided thereon an unpatterned layer of a pressure-sensitive adhesive material in accordance with an aspect of the present invention.
FIG. 3B is a schematic plan view of a device substrate having a plurality of OLED devices including a pixelated display area and an electrical interconnect area.

FIG. 3A is a schematic plan view of a portion of a cover plate configuration 250 which includes an unpatterned layer 270 of a PSA material laminated over a first surface 253 of the cover plate 252 by the method described with reference to FIG. 1C upon peeling the second release liner 272.

FIG. 3B is a schematic plan view, a portion of an OLED device configuration 300 which includes a plurality of OLED devices formed in a two-dimensional array on a first surface 303 of a device substrate 302. Each OLED device includes a pixelated display area 325 having picture elements or pixels "pix", and at least one electrical interconnect area 328. Neighbor OLED devices are separated by a spacing sx along an x-direction and by spacing sy along a y-direction.

In order to preserve visual clarity of the drawing, the pixelated structure of an OLED display area is indicated schematically within the display area of only one OLED device. Also, the positions of only three pixelated OLED display areas 325 within the two-dimensional array are indicated at 325-11, corresponding to a position 1;1, 325-31, corresponding to a position 3; 1, and 325-14, corresponding to a position 1;4 along the x-direction and along the y-direction, respectively.

The pixelated display areas 325 can be those of passive matrix OLED devices, or the pixelated display areas can be associated with active matrix OLED devices.

The cover plate configuration 250 is bonded over the OLED device configuration 300 by the process described with reference to FIG. 1D and using the guiding assembly 702 shown in FIG. 2.

Figure 9:
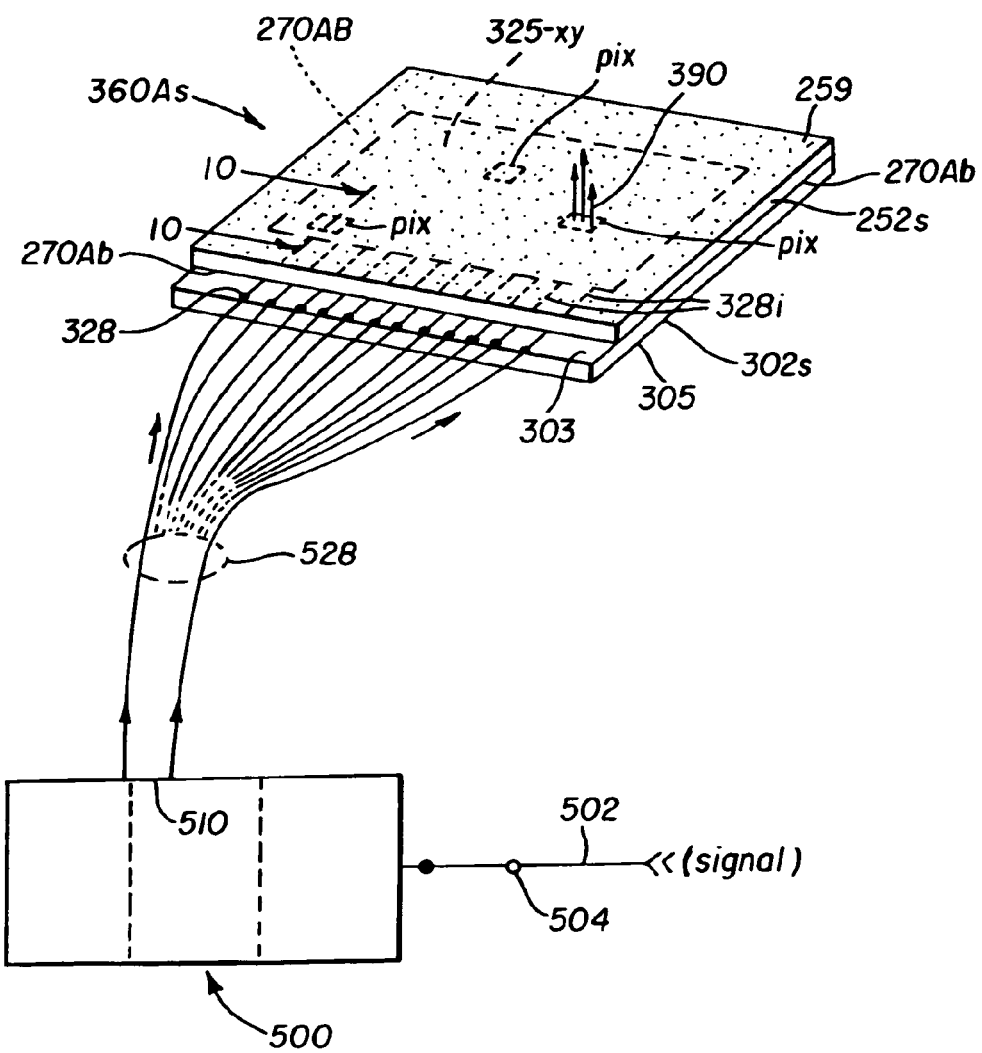
FIG. 9 is a schematic perspective view of a singulated packaged OLED device having a cover plate bonded over the device by a layer of a pressure-sensitive adhesive material in accordance with the present invention, and shown operative to provide light emission from a pixel.

Since the unpatterned layer 270 of PSA material provides for bonding the cover plate 252 over and between the pixelated display areas 325 and over the electrical interconnect areas 328, residual adhesive material has to be removed from outermost portions of the electrical interconnect area or areas upon singulating a plurality of packaged OLED devices (see FIG. 9). Removing such residual PSA material from the interconnect area(s) can be achieved, for example, by using a conventional adhesive tape. The adhesive portion of the tape is first pressed manually over the electrical interconnect area 328 having the residue of PSA material and is subsequently peeled off, thereby lifting off the residual PSA material from the electrical interconnects.

In accordance with the present invention, the PSA material can be left on the electrical interconnect area and, after singulating the devices, then subsequently removed. As will be described hereinafter, a release agent can also be used.

Figures 4A, 4B:
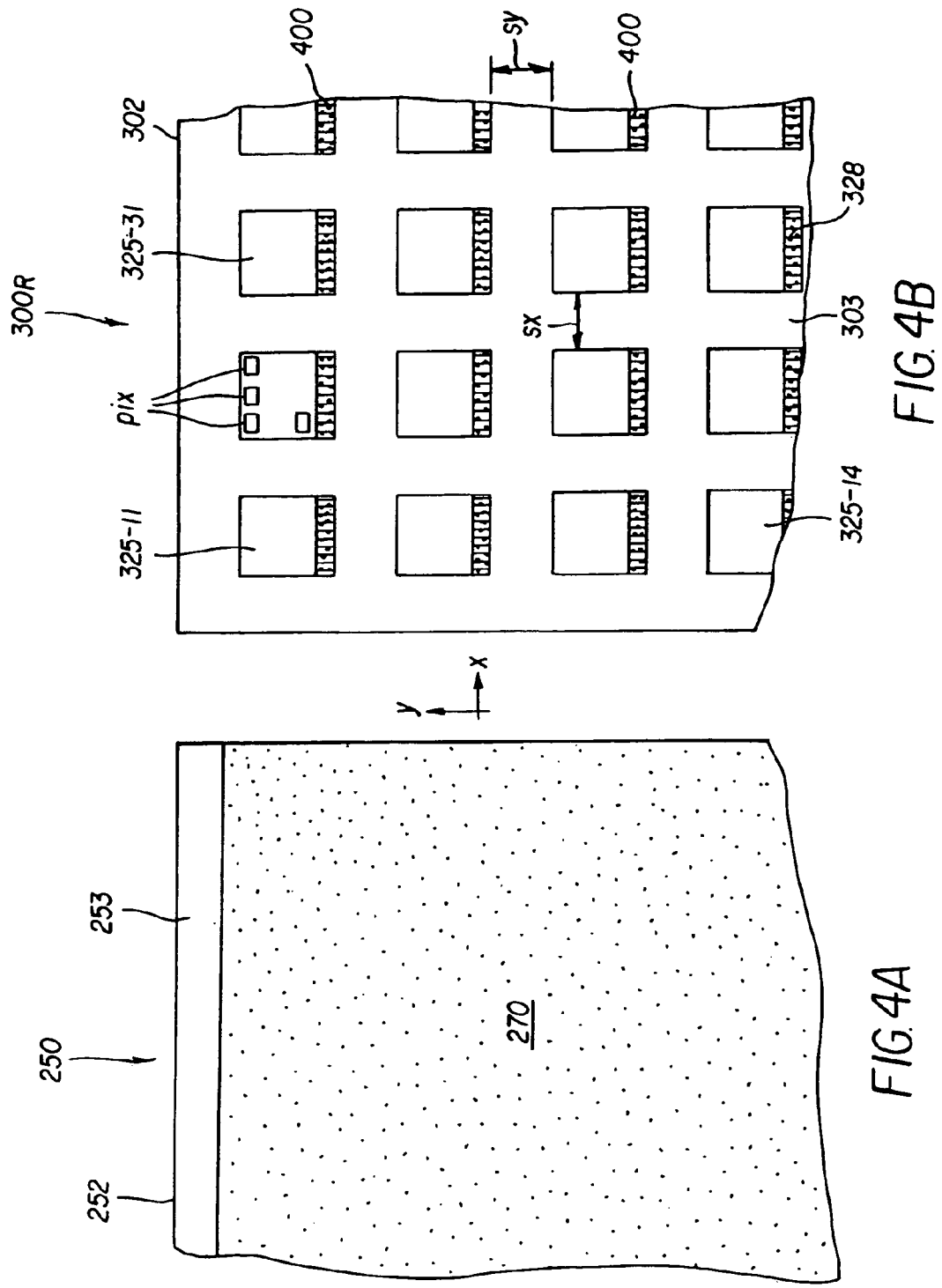
FIG. 4A is the same plan view of the cover plate as shown in FIG. 3A.
FIG. 4B is a schematic plan view of a device substrate having a plurality of OLED devices including a pixelated display area and an electrical interconnect area on which is disposed a thin film of a release agent indicated in bold dotted outline.

FIG. 4A is a schematic plan view of the same cover plate configuration 250 described above with reference to FIG. 3A.

FIG. 4B is a schematic plan view of a modified OLED device configuration 300R in which a thin film of a release agent 400, depicted in bold dotted outline, is formed over outermost portions of the electrical interconnect areas 328 by a printing process, by a spraying process, by an evaporation process, or by a sputtering process.

The release agent is selected so that the layer of the PSA material does not bond effectively, or does not bond at all, to the electrical interconnect areas 328 which are coated with such release agent. Thus, PSA material is released from these outermost portions of the electrical interconnect areas upon singulating the cover plate (see FIG. 9). The layer of PSA material is bonded strongly to that portion of the cover plate 252 which is singulated to reveal, and to provide electrical access to, the electrical interconnect areas for attaching electrical leads thereto.

The release agent 400 can be a thin film having a thickness in a range of from a few molecular monolayers to 10 nanometer. Such thin film of a release agent is sufficiently thin and electrically insulative in a lateral direction between laterally adjacent interconnect elements so that electrical leads can be reliably connected to each interconnect element of the electrical interconnect area 328 through the thin film of the release agent 400.

Preferred release agent materials include silicone compounds, organo-silicon compounds, and fluorocarbon compounds.

The cover plate configuration 250 is bonded over the OLED device configuration 300R by the process described with reference to FIG. 1D and using the guiding assembly 702 shown in FIG. 2.

FIGS. 5A–5D show schematically another process sequence which results in bonding with a patterned layer of a PSA material a common cover plate over at least pixelated display areas of a plurality of OLED devices formed on a device substrate.

Figure 5A:
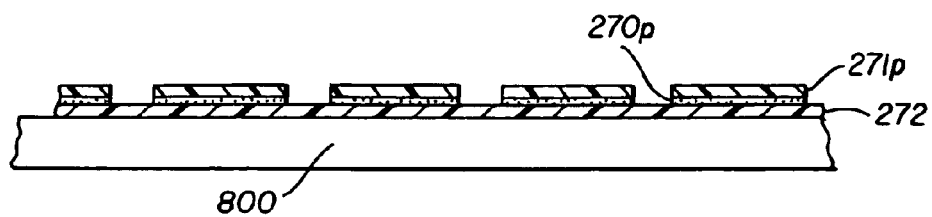
FIG. 5A is a schematic sectional view of a repeating pattern formed in the first release liner and in the adhesive layer in accordance with an aspect of the present invention, the pattern supported by the second release liner which is held on a rigid support during patterning.

FIG. 5A is a schematic sectional view of a repeating pattern formed in the first release liner 271p and in the PSA-layer 270p. The repeating patterns 271p and 270p can be formed by a rotary die cutting process which is a known process in use in manufacturing adhesive labels of various sizes and shapes. During the patterning process, the second release liner is supported on a rigid support 800 which can be a support having peripheral vacuum grooves for drawing the second release liner against the support in a planar position.

Figure 5B:
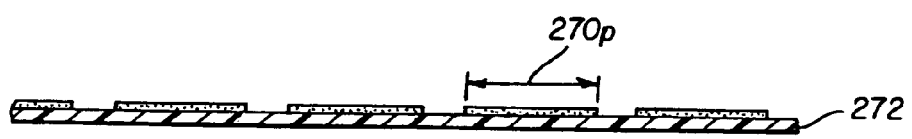
FIG. 5B is a schematic sectional view of the repeating pattern of the adhesive layer upon removal or release of the patterned first release liner.

FIG. 5B reveals the patterned layer 270p of the PSA material upon peeling or releasing the patterns 271p of the first release liner.

Figure 5C:
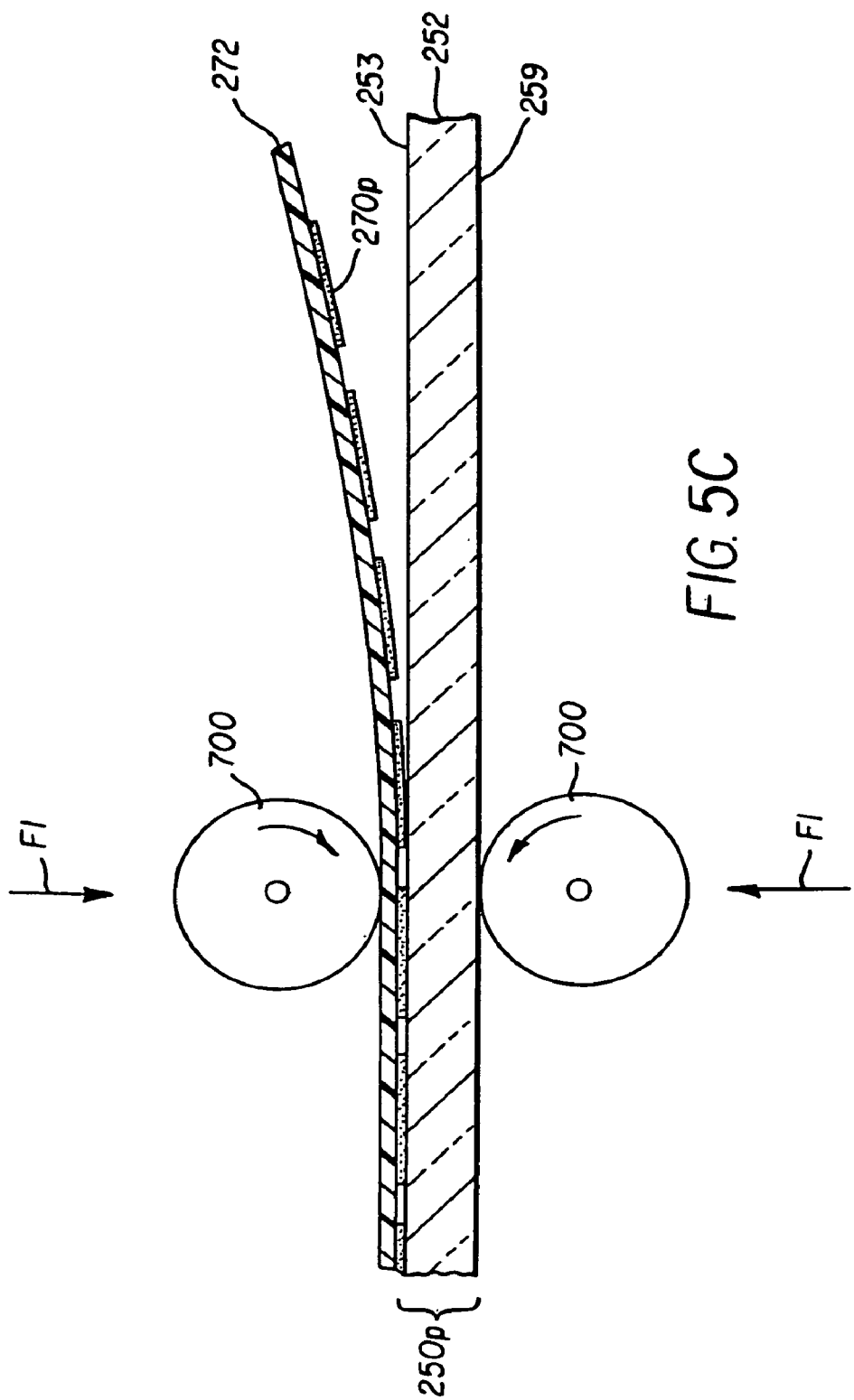
FIG. 5C indicates schematically the bonding of the repeating pattern of the layer of pressure-sensitive adhesive material to a surface of a cover plate in a pressure roller apparatus.

FIG. 5C indicates schematically the bonding of the repeating pattern 270p of the PSA material to a first surface 253 of a cover plate 252 by transporting the second release liner 272 and the cover plate 252 through the pressure roller apparatus or roller laminator 700, as described above with reference to FIG. 1C.

A cover plate configuration 250p is obtained which has a patterned layer of a PSA material bonded over portions of the first cover plate surface 253. The second release liner is now peeled off, or released from, the patterned layer 270p of the PSA material.

Figure 5D:
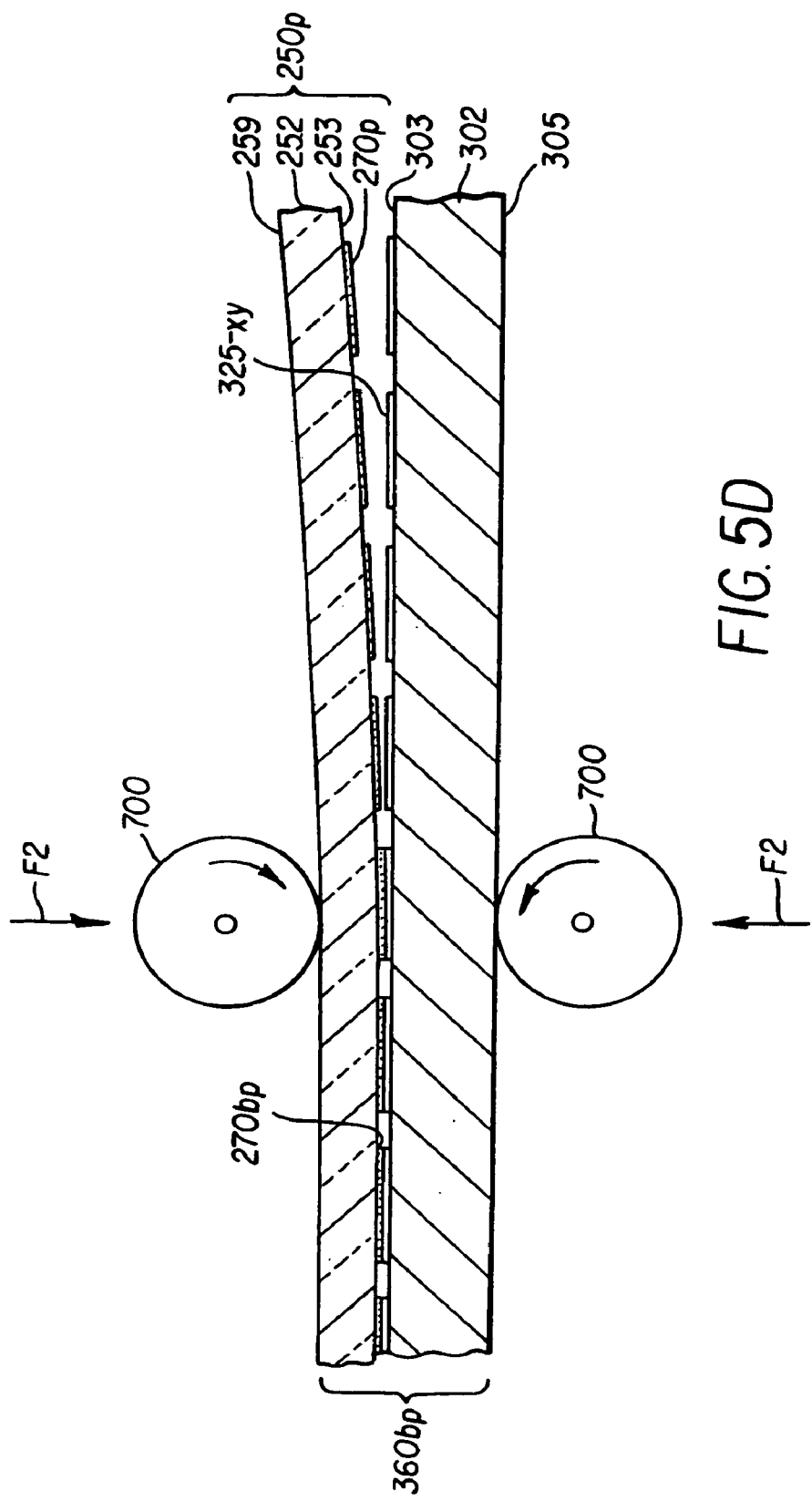
FIG. 5D shows schematically the process of bonding a cover plate over OLED devices wherein the repeating pattern of the pressure-sensitive adhesive material formed on the cover plate aligns with respectively corresponding OLED devices provided on a device substrate as the cover plate and the device substrate are being transported through a pressure roller apparatus.

FIG. 5D shows schematically the process of bonding the cover plate configuration 250p over at least the display area 325 of each one of the plurality of OLED devices formed on the first surface 303 of the device substrate 302. The bonding is achieved by transporting the cover plate configuration 250p and the device substrate in lateral alignment through the roller laminator 700 while the rollers are heated to a temperature in a range of from 40 to 75° C.

A bonding layer 270bp of a patterned PSA material is obtained which extends at least over the pixelated display areas of each OLED device while leaving electrical interconnect areas free of PSA material (see FIGS. 6A, 6C, 7A, and 8A). A bonded and aligned assembly configuration 360bp results from this process sequence and having the patterned bonding layer 270bp.

Figure 6C:
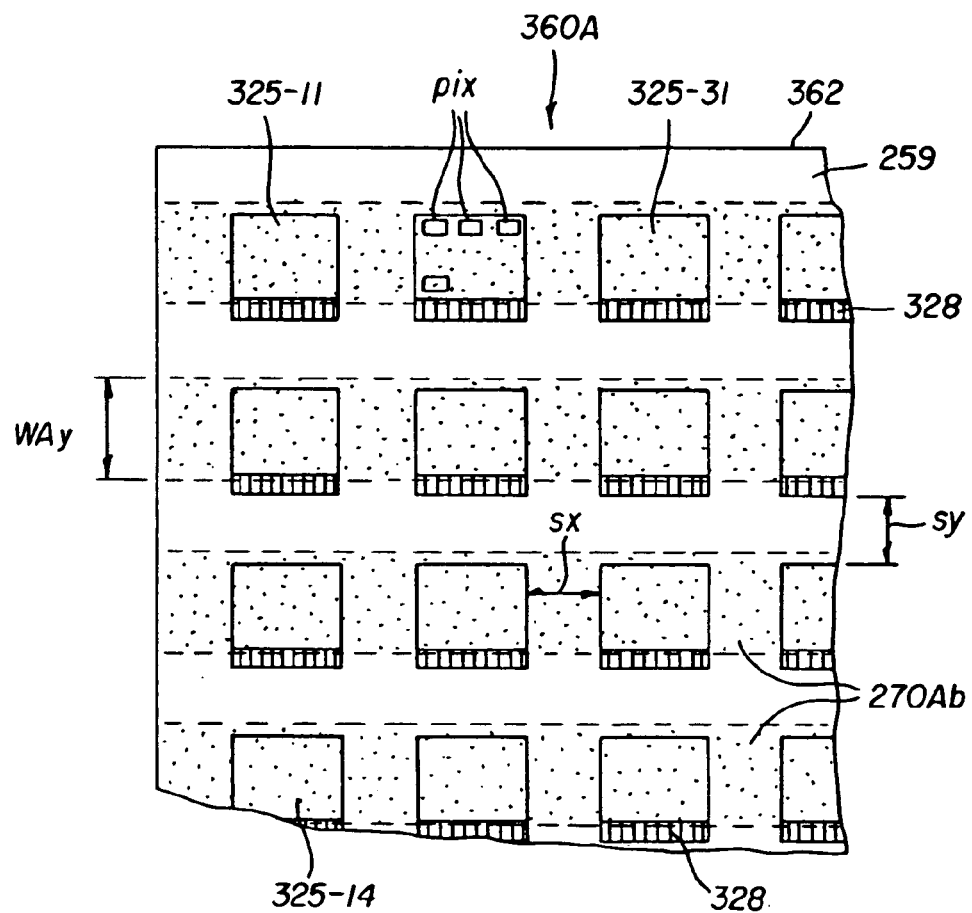
FIG. 6C is a schematic plan view of an aligned and bonded assembly of the device substrate of FIG. 6B and the cover plate of FIG. 6A, and showing uniform bonds provided over and between device display areas by the pressure-sensitive adhesive pattern while keeping electrical interconnect areas free from adhesive material in accordance with aspects of the present invention.

FIGS. 6A, 6B, and 6C are schematic plan views of respectively corresponding cover plate configurations 250A, 250B, and 250C having provided on a first cover plate surface 253 different patterns of a PSA material.

Figures 7A, 7B:
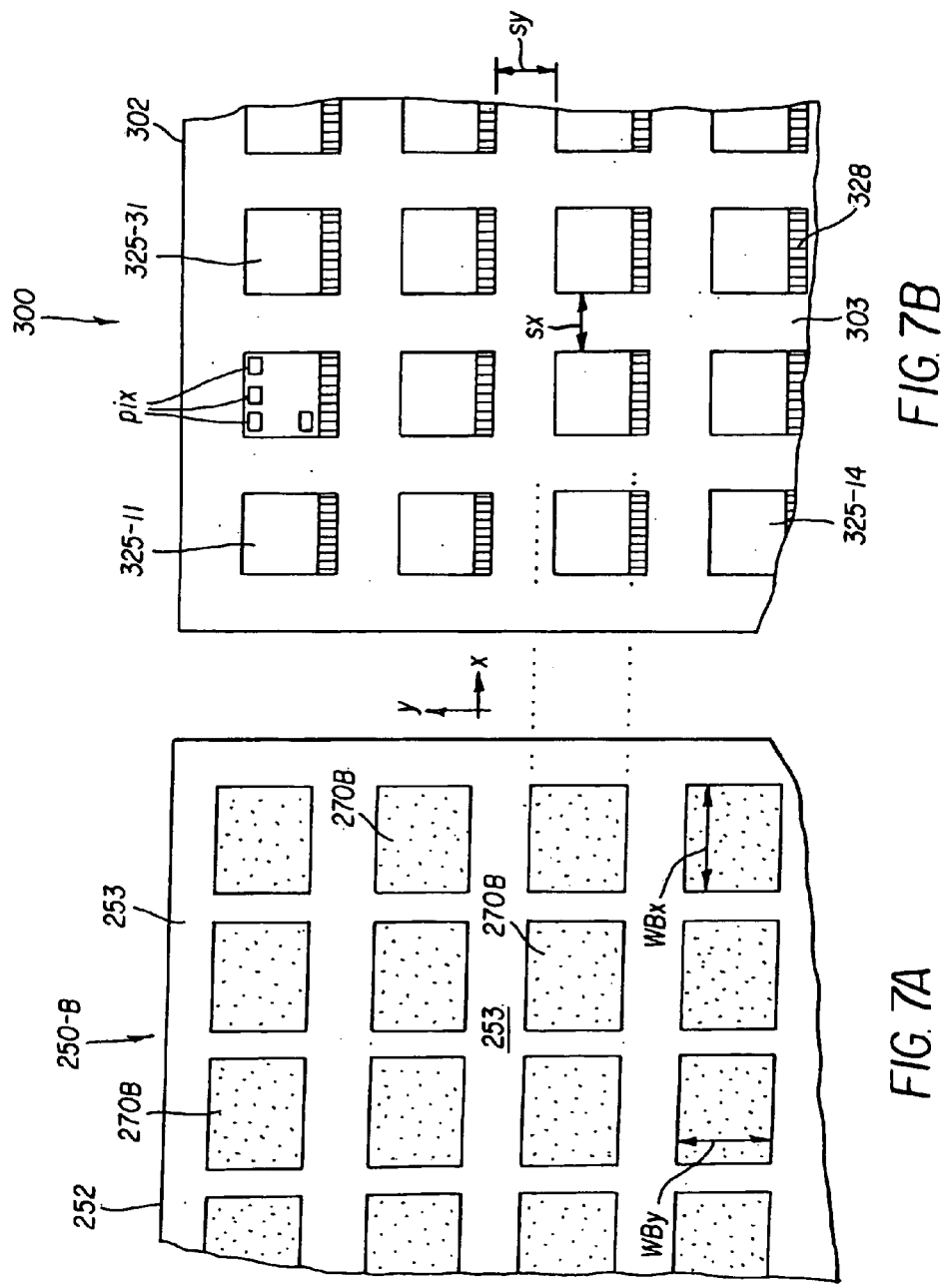
FIG. 7A is a schematic plan view of a cover plate having provided thereon a plurality of rectangular patterns of a pressure-sensitive adhesive material in accordance with an aspect of the present invention.
FIG. 7B is the same plan view of the device substrate as shown in FIG. 3B.
Figure 8B:
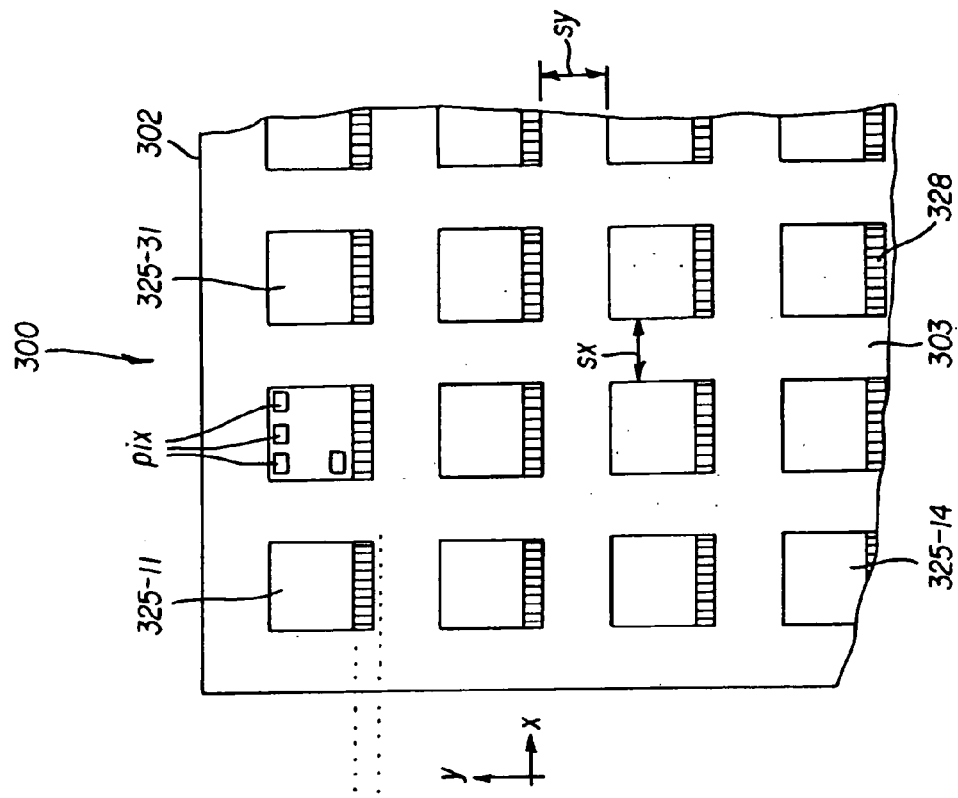
FIG. 8B is the same plan view of the device substrate as shown in FIG. 3B.

FIGS. 6B, 7B, and 8B are schematic plan views of OLED device configurations 300 which are identical to the device configuration described above with reference to FIG. 3B.

In FIG. 6A, a unidirectional and laterally spaced pattern of stripes 270A of a layer of PSA material extends along an x-direction across the first surface 253 of the cover plate. Each of the stripes has a width dimension WAy in a y-direction. The unidirectional stripe pattern is formed by rotary die cutting as described previously with reference to FIG. 5A, and the pattern of the PSA material is laminated to the cover plate by the process described with reference to FIG. 5C.

The lateral spacing between adjacent stripes and the width dimension WAy of the stripes is selected to be aligned with respect to the OLED devices on the device substrate 302 so that outermost portions of the electrical interconnect areas 328 remain free of PSA material while at least the display areas 325 of the OLED devices and areas between adjacent display areas along an x-direction receive a bonded cover plate, as indicated by dotted reference lines which extend between FIGS. 6A and 6B.

The cover plate configuration 250A is bonded over the OLED device configuration 300 by the process described above with reference to FIG. 5D.

FIG. 6C is a plan view of the bonded and aligned assembly configuration 360A in which the cover plate is bonded over the device substrate by the stripe pattern 270Ab of the PSA material. A common edge 362 of the aligned and bonded cover plate and device substrate is indicated.

If the OLED device configuration 300 of FIG. 6B includes an additional electrical interconnect area (not shown in the drawings) located along an opposing side of the electrical interconnect areas 328, the width dimension WAy of the stripes of PSA material is selected so that such additional electrical interconnect areas also remain free from PSA material.

FIG. 7A is a schematic plan view of a cover plate configuration 250B in which a layer of a PSA material has been patterned to provide a plurality of laterally spaced rectangles or squares 270B over the first surface 253 of the cover plate 252. Such patterning can be achieved by the rotary die cutting process described with reference to FIG. 5A, and bonding of the patterned layer of PSA material to the cover plate can be accomplished by the process described with reference to FIG. 5C.

The adhesive pattern is depicted with rectangles having a width dimension WBx along an x-direction and a width dimension WBy along a y-direction. Dotted reference lines extending between FIG. 7A and FIG. 7B indicate the positions of bonding the cover plate configuration 250B in alignment with respect to the OLED devices of the device configuration 300.

The patterns 270B of the layer of PSA material can have width dimensions WBx and WBy which are selected so that bonding of the common cover plate is provided only over the pixelated display area 325 of each OLED device of the device configuration 300. Thus, the patterns 270B can be scaled dimensionally to provide effective cover plate bonding over a plurality of OLED devices which can have electrical interconnect areas extending along four peripheral portions of the pixelated display areas 325.

Figure 8A:
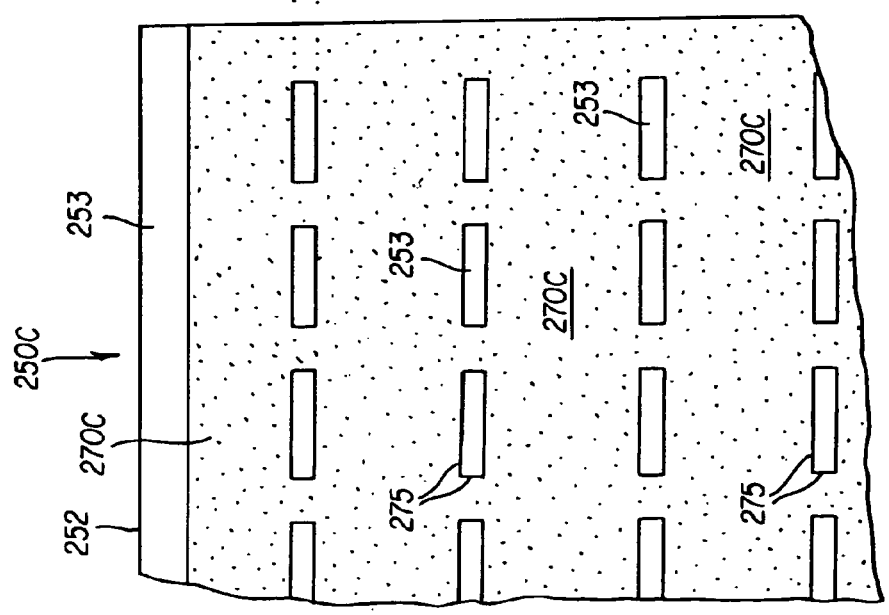
FIG. 8A is a schematic plan view of a cover plate having provided thereon a layer of a pressure-sensitive adhesive material in which a pattern of rectangular cut-outs or openings is arranged.

FIG. 8A is a schematic plan view of a cover plate configuration 250C in which a layer of a PSA material 270C has been patterned to provide a plurality of cut-outs or openings 275 arranged to align with the electrical interconnect areas 328 of the OLED devices of the device configuration 300 of FIG. 8B as indicated by dotted reference lines extending between FIG. 8A and FIG. 8B. If the OLED devices are formed to have more than the one electrical interconnect area 328, additional cut-outs or openings can be provided in the PSA-layer in spatial correspondence with the locations of additional electrical interconnect areas.

Turning to FIG. 9, a schematic perspective view is shown of a singulated packaged OLED device 360As which has been singulated from the assembly configuration 360A of FIG. 6C, and indicating the bonding layer 270A of the PSA material.

The singulated device substrate 302s and the singulated transparent cover plate 252s share common singulated dimensions along three edges. In order to reveal, and make accessible, at least the outermost portions of the electrical interconnect area 328, the singulation of the cover plate is offset laterally with respect to the device substrate along the interconnect area.

First and second surfaces 303 and 305, respectively, of the singulated device substrate 302s are shown. Also indicated is the second surface 259 of the singulated cover plate 252s.

The singulated OLED device 360As is depicted here as an example of a top-emitting device having a singulated transparent cover plate 252s.

Light emission 390 from a pixel is directed toward an observer through the transparent cover plate and its second surface 259. Light emission, of any one pixel at an instant of time, occurs in response to electrical drive signals and electrical control signals provided at the electrical interconnect area 328 by electrical leads 528 connected thereto. Electrical leads 528 are the output leads issuing from an output terminal 510 of a power supply, scan line generator, and signal processor 500 which, in turn, receives an input signal at an input terminal 504 via a signal lead 502.

The pixelated display area 325-xy (and its associated electrical interconnect area 328) can be that of any of the OLED devices singulated from the assembly 360A of FIG. 6C.

The outermost portions 328 of the electrical interconnect area extend in the form of inner portions 328i under the bonded cover plate to the display area 325-xy.

Figure 10:
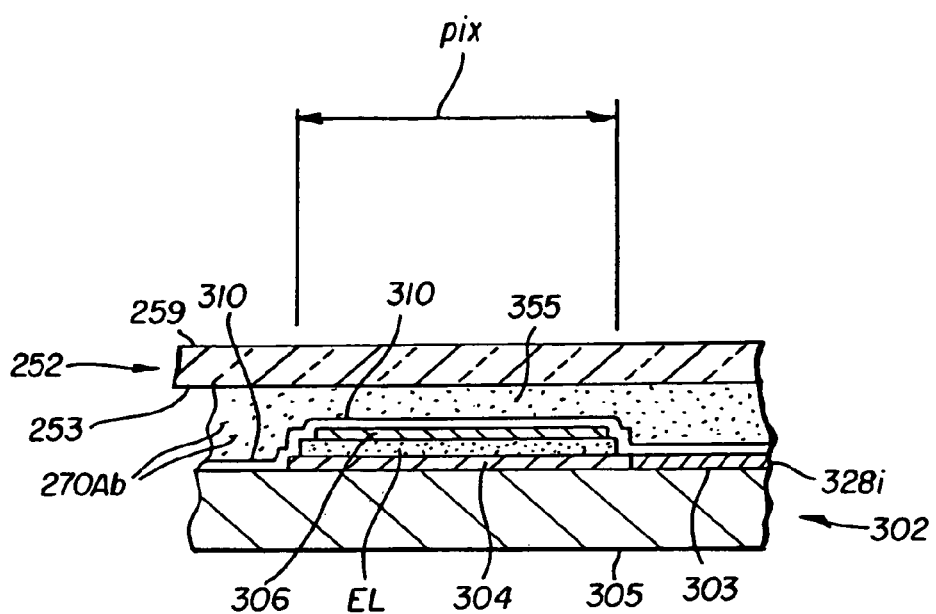
FIG. 10 is an enlarged sectional view of a pixel of the OLED device of FIG. 9, and showing an encapsulation layer and an inner portion of an electrical interconnect member.

FIG. 10 is a schematic enlarged view of a pixel "pix" taken along the section lines 10—10 of the assembly configuration 360A of FIG. 9.

A device substrate 302 has opposing first and second surfaces 303 and 305, respectively. The pixel includes an anode electrode layer 304 formed on the first surface 303 of the device substrate 302. The anode electrode layer 304 is in electrical contact with a metallized conductor (not identified) which is the inner portion 328i of the electrical interconnect area 328. An organic EL medium structure is provided over a portion of the anode electrode layer 304, and a cathode electrode layer 306 is provided over a portion of the EL medium structure. An electrical interconnect element or elements dedicated to the cathode electrode layer(s) is not shown in this drawing. A transparent encapsulation layer 310 fully encapsulates the pixel and inner portions of the electrical interconnects to provide an effective barrier against moisture penetration and oxygen penetration.

A transparent encapsulation layer 310 can be formed by known thin-film deposition methods such as, for example, thermal vapor deposition, sputter deposition, or atomic layer deposition. Materials suitable as encapsulation layer materials include aluminum oxide, silicon nitride, silicon-oxinitride, and tantalum oxide. Due to the thin-film structure of such encapsulation layer, it does not provide adequate mechanical protection. Thus, a bonded cover plate is required to ensure mechanical protection of the OLED devices.

The bonding layer 270Ab uniformly bonds the first cover plate surface 253 over all topological features of the pixel, including the spacing 355 between an upper surface of the encapsulation layer 310 and the surface 253.

As described above, in a top-emitting OLED device configuration, the cathode electrode layer 306, the encapsulation layer 310, the bonding layer 270Ab of the PSA material, and the cover plate 252 have to be transparent elements for the light generated within the EL medium structure. A transparent cover plate can be a glass plate, a quartz plate, or a polymer plate such as, for example, a polycarbonate plate.

If the OLED devices are configured as bottom-emitting devices, the anode electrode layer 304 and the device substrate have to be transparent elements. The cover plate can be constructed from an optically opaque material which can be optically reflective or optically absorptive. For example, an optically reflective cover plate can take the form of a metal plate having a reflective first surface 253, a ceramic plate having such reflective surface, a glass plate having a reflective first surface 253, or a polymer plate having such reflective surface.

An optically absorptive cover plate can take the form of a polymer cover plate which includes a dye selected to absorb the light generated within the EL medium structure. Alternatively, an optically absorptive cover plate can be a transparent cover plate or a ceramic cover plate having deposited on the first surface 253 an absorptive layer.

The invention has been described in detail with particular reference to certain preferred embodiments thereof, but it will be understood that variations and modifications can be effected within the spirit and scope of the invention.

PARTS LIST 250 cover plate configuration with unpatterned layer of a pressure-sensitive adhesive (PSA) material
250p cover plate configuration with patterned layer of a PSA material
250A cover plate configuration with a first pattern of a layer of a PSA material
250B cover plate configuration with a second pattern of a layer of a PSA material
250C cover plate configuration with a third pattern of a layer of a PSA material
252 cover plate
252s singulated cover plate
253 first surface of cover plate (252)
259 second surface of cover plate (252)
270 unpatterned layer of a PSA material
270A unidirectional stripe pattern(s) of a layer of PSA material
270B rectangular or square pattern(s) of a layer of PSA material
270C layer of PSA material with pattern(s) of cut-outs or openings (275)
270bu bonding layer of unpatterned PSA material
270p patterned layer of a PSA material
270bp bonding layer of patterned PSA material
270Ab bonding layer of PSA material with stripe pattern (270A)
271 first release liner
271p patterned first release liner
272 second release liner
275 cut-outs or openings formed in layer of PSA material (270c)

PARTS LIST (con't)

300 OLED device configuration with an electrical interconnect area
300R OLED device configuration with an electrical interconnect area having a release agent (400)
302 device substrate
302s singulated device substrate
303 first surface of device substrate (302)
304 anode electrode layer
305 second surface of device substrate (302)
306 cathode electrode layer
310 encapsulation layer
325 pixelated OLED display area
325-11 pixelated OLED display area at a position (1;1)
325-14 pixelated OLED display area at a position (1;4)
325-31 pixelated OLED display area at a position (3; 1)
325-xy pixelated OLED display area at a position (x;y)
328 outermost portion(s) of electrical interconnect area(s)
328i inner portion(s) of electrical interconnect area(s)
355 spacing between upper surface of encapsulation layer (310) and first surface (253) of cover plate (252)
360A bonded and aligned assembly configuration having the stripe pattern (270A) of the layer of PSA material
360As singulated packaged OLED device (from assembly configuration 360a)
360bp bonded and aligned assembly configuration having a patterned layer of a PSA material
360bu bonded assembly configuration having an unpatterned layer of a PSA material

PARTS LIST 362 common edge(s) of aligned and bonded cover plate (252) and device substrate (302)
390 light emission from a pixel
400 thin film of release agent formed over electrical interconnect areas (328)
500 power supply, scan line generator, and signal processor
502 signal lead
504 input terminal
510 output terminal
528 electrical leads
700 pressure roller apparatus, or roller laminator
702 guiding assembly
710 device substrate feed table
712 feed table surface
720 feed guide
722 feed guide recess for slideably accepting an edge of the device substrate (302)
724 feed guide surface for cover plate (252)
800 rigid support
EL organic electroluminescent ("EL") medium structure
F1 force on pressure rollers for laminating layer of PSA material to cover plate surface (253)
F2 force on pressure rollers for bonding cover plate (252) to device substrate (302)
pix light-emitting portion of a pixel
sx spacing between OLED devices along an x-direction
sy spacing between OLED devices along a y-direction

PARTS LIST

WAy width dimension in a y-direction of pattern (270A)
WBx width dimension in an x-direction of pattern (270B)
WBy width dimension in a y-direction of pattern (270B)
x x-direction
y y-direction

The invention claimed is:
1. A method of bonding a cover plate over a plurality of OLED devices formed on a surface of a device substrate wherein each one of the plurality of OLED devices includes a pixelated display area and at least one electrical interconnect area, comprising:
a) providing the device substrate having the plurality of OLED devices formed on a surface thereof;

b) providing the cover plate having disposed on one surface thereof a layer of a pressure-sensitive adhesive material;

c) transporting the cover plate in alignment with the device substrate through a pressure roller apparatus so that the layer of the pressure-sensitive material provides uniform bonding between the cover plate and each OLED device on the device substrate, thereby achieving a plurality of packaged OLED devices; and d) singulating the device substrate and the bonded cover plate to provide a plurality of individual and packaged OLED devices having a bonded cover plate and permitting access to at least outermost portions of the at least one electrical interconnect area for attaching electrical leads thereto.

2. The method of claim 1 wherein element a) includes providing top-emitting OLED devices, and element b) includes providing a transparent cover plate having disposed on the one surface the layer of a transparent pressure-sensitive adhesive material.

3. The method of claim 1 wherein element a) includes providing bottom-emitting OLED devices formed on a transparent device substrate, and element b) includes providing an optically reflective cover plate or an optically absorptive cover plate.

4. The method of claim 1 wherein element c) includes transporting the cover plate in alignment with the device substrate through the pressure roller apparatus while heating the pressure rollers to a temperature in a range of from 400° C. to 750° C. so that uniform bonding is achieved over all topological features of the OLED devices.

5. The method of claim 1 wherein element a) includes depositing a release agent over outermost portions of each of the at least one electrical interconnect area for releasing the adhesive material from such outermost portions upon singulating the cover plate.

6. The method of claim 5 further including depositing the release agent by a printing process, by a spraying process, by an evaporation process, or by a sputtering process.

7. The method of claim 6 including depositing the release agent from the group consisting of silicone compounds, organo-silicon compounds, and fluorocarbon compounds.

8. The method of claim 1 wherein element c) includes guiding the device substrate and the cover plate prior to and during transporting through the pressure roller apparatus.

9. The method of claim 8 further including guiding at least one lateral edge of the device substrate and the cover plate, respectively.

10. The method of claim 1 wherein element d) includes lifting of residual adhesive material from the outermost portions of the electrical interconnect area upon singulating.

11. A method of bonding a cover plate over a plurality of OLED devices formed on a surface of a device substrate wherein each one of the plurality of OLED devices includes a pixelated display area and at least one electrical interconnect area, comprising:

a) providing the device substrate having the plurality of OLED devices formed on a surface thereof;

b) providing the cover plate having disposed on one surface thereof a patterned layer of a pressure-sensitive adhesive material and at least at positions corresponding to positions of the pixelated display areas of the OLED devices;

c) transporting the cover plate in alignment with the device substrate through a pressure roller apparatus so that the layer of the pressure-sensitive material provides uniform bonding between the cover plate and at least the pixelated display area of each OLED device on the device substrate, thereby achieving a plurality of packaged OLED devices; and d) singulating the device substrate and the bonded cover plate to provide a plurality of individual and packaged OLED devices having a bonded cover plate and permitting access to at least outermost portions of the at least one electrical interconnect area for attaching electrical leads thereto.

12. The method of claim 11 wherein element b) includes forming a pattern in the layer of the pressure-sensitive adhesive material prior to disposing the patterned layer on a surface of the cover plate.

13. The method of claim 12 further including selecting a pattern which keeps outermost portions of the at least one electrical interconnect area of each OLED device free from adhesive material.

14. The method of claim 13 including selecting a pattern of laterally spaced unidirectional stripes, a pattern of laterally spaced rectangles, squares, or a pattern of laterally spaced openings formed in the layer of the pressure-sensitive adhesive material, the positions of such openings corresponding to positions of outermost portions of the at least one electrical interconnect area of each one of the plurality of OLED devices.

* * * * *

UNITED STATES PATENT AND TRADEMARK OFFICE
CERTIFICATE OF CORRECTION

PATENT NO.         : 7,135,352 B2                                        Page 1 of 1
APPLICATION NO. : 10/787513
DATED              : November 14, 2006
INVENTOR(S)        : Joseph E. Yokajty et al.

It is certified that error appears in the above-identified patent and that said Letters Patent is hereby corrected as shown below:

Col. 15, lines 29 and 30;
Claim 4, lines 4 and 5        "400°C to 750°C" should be --40°C to 75°C--.

Signed and Sealed this

Tenth Day of April, 2007

JON W. DUDAS
*Director of the United States Patent and Trademark Office*